United States Patent
Shaffer et al.

[11] Patent Number: 5,235,699
[45] Date of Patent: Aug. 10, 1993

[54] TIMING CALIBRATE AND TRACK CONTROL CIRCUIT

[75] Inventors: James M. Shaffer, Boise; Karl H. Mauritz, Eagle; Henry D. Gerdes, Boise, all of Id.; Geary L. Leger, Fremont, Calif.

[73] Assignee: Micron Technology, Inc., Boise, Id.

[21] Appl. No.: 649,771

[22] Filed: Feb. 1, 1991

[51] Int. Cl.⁵ .............................. G06F 13/00
[52] U.S. Cl. .................. 395/550; 364/934.4; 364/270.8
[58] Field of Search ................. 395/550, 425; 364/270.8, 934.4

[56] References Cited

U.S. PATENT DOCUMENTS

| | | | |
|---|---|---|---|
| 4,631,701 | 12/1986 | Kappeler et al. | 395/425 |
| 4,665,495 | 5/1987 | Thaden | 364/900 |
| 4,734,880 | 3/1988 | Collins | 395/425 |
| 4,967,397 | 10/1990 | Walck | 364/900 |
| 4,996,474 | 2/1991 | Tambe et al. | 324/78 D |
| 5,014,190 | 5/1991 | Johnson | 364/200 |

Primary Examiner—Dale M. Shaw
Assistant Examiner—Diane E. Smith
Attorney, Agent, or Firm—Stanley N. Protigal

[57] ABSTRACT

A circuit that controls, calibrates and monitors critical timing parameters in a computer system or network to prevent loss of, or inaccurate data, when transferring this data.

7 Claims, 2 Drawing Sheets

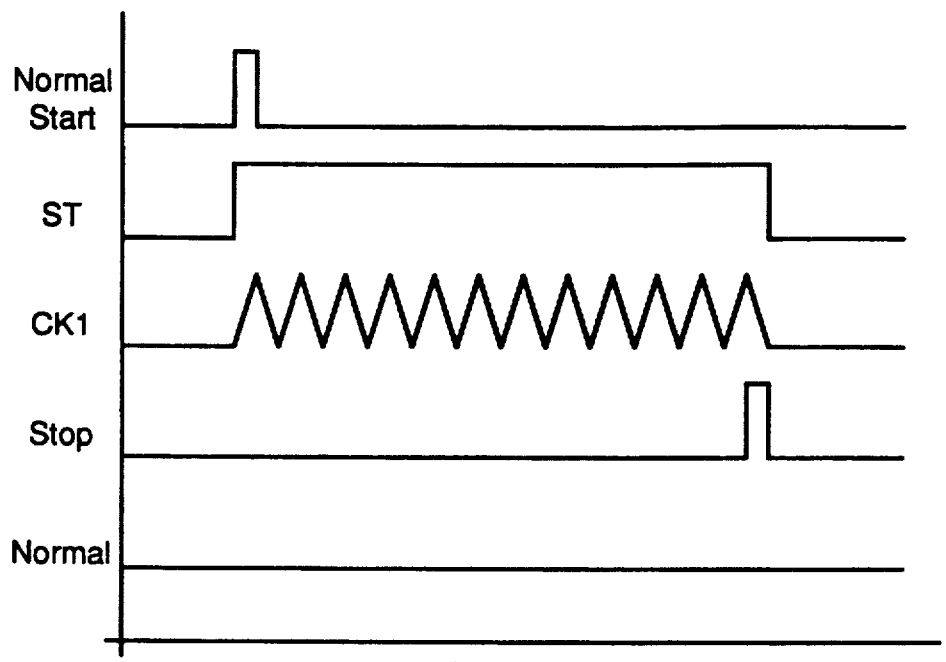
FIG. 2
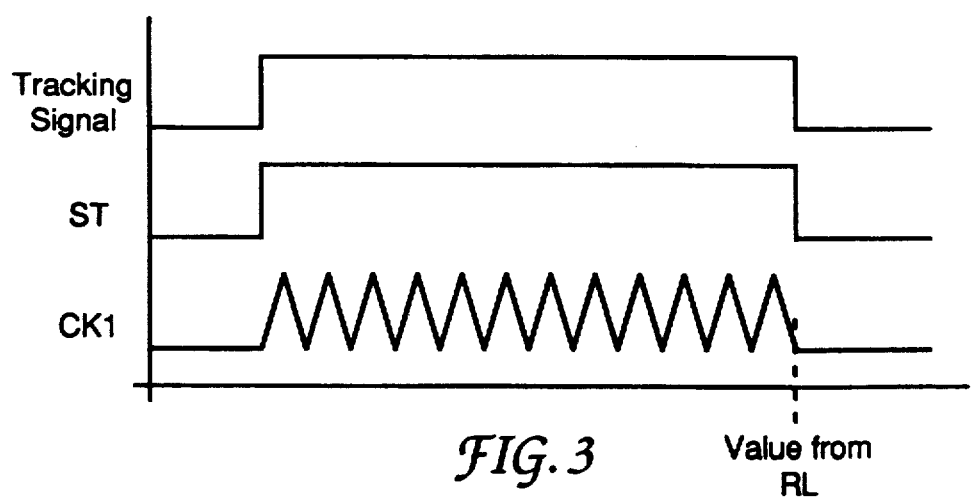
FIG. 3    Value from RL

TIMING CALIBRATE AND TRACK CONTROL CIRCUIT

FIELD OF THE INVENTION

This invention relates to computer bus addressing systems, such as memory addressing systems for memory arrays. It is particularly directed to monitoring and adjusting timing parameters in addressing a memory array which is connected to a computer CPU (central processing unit) through a multiline bus.

BACKGROUND OF THE INVENTION

Computers have been designed with architectures which permit a central processor to respond to an initial set of instructions, called BIOS, followed by instructions from an operating program (operating system software), followed by further programming information embodied by the particular program being run. Various forms of memory are addressed through this architecture. DOS-compatible computers (compatible with MS DOS software, from Microsoft Corporation of Redmond, Washington) have such an architecture. (These computers are also generally operable with other operating systems, such as OS2, UNIX, etc.)

The industry has flourished by using standardized operating programs in order to define the operation of a computer. The standard operating program permits computers from different manufacturers to behave similarly, a fact that is not lost to software developers, who design their programs to operate from the operating system ("DOS") instead of directly from the computer's BIOS. These circumstances provide what is often referred to as DOS compatible computers. These are colloquially referred to as IBM compatible computers, even though specific architectures of the computers differ.

In most computers, the CPU includes system base memory, and read only memory associated with a basic input/output system (BIOS). "BIOS" is an acronym for basic input/output system. It is a set of programs that reside in non-volatile ROM memory. The BIOS includes the power-on diagnostics, a boot-up program, and device drivers for the keyboard, disk, display, serial ports, printer port, and miscellaneous functions.

The BIOS of a personal computer takes control when power is switched on, setting up the hardware devices, running tests, and booting up the operating system from the disk. (Without a BIOS for the operating system, the machine is an unusable, non-operating collection of hardware components.) The BIOS is a collection of programs stored on a read-only memory chip and is usually considered to be part of the hardware set, but these routines are like any other software. They can be analyzed, understood, modified and re-created as desired, provided that the BIOS resides in programmable media.

Most DOS compatible computers use the same set of bus addresses for addressing similar peripherals and hardware. This enables hardware manufacturers to provide hardware which functions with different computers. The ability to use standardized hardware in a computer has become commonplace.

One type of popular hardware is a memory board residing on an expansion bus (ISA or Industry Standard Architecture bus). The timing problems with buses on DOS compatible computers are varied and complex. Even though the bus address protocols, and often the mechanical dimensions and pin definitions on busses on various DOS compatible computers are reasonably standardized, the exact timing varies among different manufacturers.

The circuits use complementary Metal-Oxide Semiconductor (CMOS) technology. The time delays through any MOS circuit are very dependent on temperature and supply voltage changes. Time variations as great as 50% to 60% over normal temperature-voltage operation are common and 300% from chip to chip variations.

Also, there are several operational modes that further complicate the problem. There are various bus clock speeds from 6 Mhz up to 33 Mhz. There are various wait states: 0, 1 and 2. There are also modes of "normal Row Address Select (RAS)" and "early RAS". Early RAS is composed by decoding the address and other partial results from the bus and applying RAS to the DRAM before the complete bus cycle is present there or starting the DRAM cycle early.

These timing variations have caused many problems for manufacturers of add-on boards for DOS compatible computers.

In the prior art, board manufacturers have dealt with these problems through the careful selection of fixed delays, thus attempting to be compatible with as many DOS compatible computers as possible. These delays are usually controlled by either delay lines or resistor-capacitor circuits.

This invention relates to a timing calibrate and track control (TCTC) circuit which is used to set-up and control critical timing parameters of add-on printed circuit boards plugged into computer buses. The circuit can provide pre-determined timing signals and compensate the signals based on temperature and supply voltage variations.

A first embodiment of the TCTC was designed for use as a memory add-on board for the ISA bus in the IBM AT (T.M.) and other DOS compatible computers. The timing problems associated with the transfer of signals and data within the ISA buses are varied and complex.

As used herein, a bus is a set of signal lines used by an interface system to which a number of devices are connected, and over which information is transferred between devices. There are many manufacturers of DOS compatible computers which share address and pin definitions with the IBM AT. Even though the mechanical dimensions and pin definitions on various AT buses are reasonably standardized, the exact timing varies among different manufacturers. This (TCTC) concept will work for any bus philosophy to speed a bus cycle up.

A popular version of the IBM AT bus had a maximum throughput for memory in input/output (I/O) of about 2.66 megabytes per second. With the use of newer and larger 32-bit processors running at 33 MHz, a condition wherein the signals on the AT bus begin bumping into each other (a phenomenon called "bus ringing") causing the communications on the bus to break down. The potential for spurious signals are increased at these higher frequencies. It can be seen that as personal computers are being used at faster bus cycles, timing becomes more critical.

More specifically, the fetching of data, or instruction cycle, and the writing of data to the DRAM requires time delays for address setup time and hold time, RAS address to RAS delays, and CAS address to CAS delays. This timing is often controlled by a delay circuit using a resistor-capacitor (RC) typically fabricated using complementary metal oxide semiconductor technology. These RC delays are currently fixed by the system hardware and unfortunately are subject to variation as a function of supply voltage and component temperature.

There are several operational modes that further complicate the problem. There are various bus clock speeds from 6 MHz up to 33 MHz and higher. The various clock speeds can complicate the bus timing. The timing is further complicated by the need to accommodate various CPU speeds on a reading of data or instructions in which data has to be present on to the BUS. This means that the CPU speed and data hold times are the complexities that must be dealt with for each board that is instated into the BUS.

There are various wait states typically 0, 1 and 2, that must be dealt with. As the CPU gets faster, each board must analyze how fast the CPU is and when data must be present on the BUS. The appropriate wait states are inserted to match the newly added board with the speed of the CPU. Adding to many wait states slows down the total system; too little wait states as the CPU reads the data and the data is not present, will crash the system.

There are modes of normal Row Address Select (RAS) and early RAS. Decoding the BUS cycle and applying RAS as early as possible into that cycle permits that access to be unique is on the early RAS cycle. Different CPU speeds have different BUS timings and BUS ringing makes the selection somewhat complex for early RAS cycle of the DRAM, however, the normal BUS cycle may require too many wait states therefore, slowing the system down.

These variable timing requirements have caused many problems for manufacturers of add-on boards for AT buses, and the prior art board manufacturers have dealt with these problems through the careful selection of fixed delays, thus attempting to be compatible with as many clones as possible. These delays are usually controlled by either delay lines or resistor-capacitor circuits. It is believed that all board manufacturers use fixed delays and no one is using a method to calibrate and track timing control such as the TCTC.

SUMMARY OF THE INVENTION

An add-on computer circuit board is provided with a circuit to adjust timing, referred to as a timing calibrate and track control (TCTC) circuit. The TCTC circuit is used to set-up and control critical timing parameters of add-on boards plugged into computer buses. The advantages of the TCTC are:

a) Initial calibration of the timing circuit is done by software at installation, and is transparent to the user; or could also be done by hardware at power-up.

b) At installation, each critical timing parameter is tailored to the particular bus being used. The installation software will store this timing information in non-volatile memory, such as EEPROM. In this manner, set-up and configuration information is loaded from the EEPROM to the TCTC on each subsequent power-up, or computer re-boot.

c) The TCTC will automatically track timing variations due to temperature and voltage by referencing an external timing, temperature and voltage compensated timing signal.

d) Register outputs are available for tests, trouble shooting and timing analyses.

e) Manufacturing repeatability (consistency from board to board) is improved over boards that use fixed delays to control timing, therefore speeding up the system by using fewer wait states.

In normal operation, test mode is disabled, and a multiplexer responds to a normal start signal.

Upon detection of the starting signal, the TCTC activates a ring oscillator which provides a clock to a counter. This counter's output is compared to another register loaded by software or preset in hardware. When their values are equal (value adjusted by tracking circuit to temp compensate) a stop signal is issued by the TCTC. Thus, a new signal of a predetermined duration has been generated with a predictable start and stop time.

The invention will find immediate use in controlling T-CAC (Column Address Select to memory access), and in controlling T-RP (Row Address Select precharge time) in dynamic memory systems. This permits controlling critical timing parameters in dynamic memory subsystems.

When Micron sells an add-on board, installation software is included with the product. For the inventive board with a TCTC, the software will set-up the initial values of registers C1 and R1. Alternatively, the initial values may be preset or determined by hardware.

The tracking signal shown in FIG. 1 is derived from an internal clock or from a crystal oscillator clock used on the computer bus. Such oscillators have better than 0.01% accuracy over temperature and voltage. Since the TCTC tracking is based on the accuracy of the crystal, precise tracking is accomplished to compensate for temperature and voltage variations. For the application using an AT bus, the tracking signal will be derived from the bus crystal clock which is approximately 14.381 MHz.

The memory refresh cycle is preferably used for tracking, since there are no memory reads nor writes during refresh in ISA architecture, and tracking during refresh is transparent to the user.

At the end of the duration of the tracking signal, a difference signal is used to generate a new timing value. As the oscillator varies with temperature and voltage, the timing value will change to compensate later during the normal timing generation.

The tracking system permits remote trouble shooting of the board, provided that the user's computer has a modem attached. This would give the engineer a reading of the exact timing of the user's bus with the board plugged into it. Additionally, these registers are useful for design evaluation and production test.

While the initial design was directed to use with the IBM AT and similar DOS compatible computers, it is anticipated that the invention, when exploited, will be used with later generation computers.

This invention provides a circuit to generate accurate timing signals that are compensated for voltage and temperature variations in the computer devices. The circuit also tests and monitors these signals during certain computer cycles. The advantages of this TCTC are:

1. the initial calibration of the timing circuit is done by software at installation or by hardwares, and is transparent to the user;

2. at installation, each critical timing parameter is tailored to the particular bus being used. The installation software will store this timing information in non-volatile memory, such as EEPROM. In this manner, set-up and configuration information is loaded from the EEPROM to the TCTC on each subsequent power-up, or computer reboot;

3. the TCTC will automatically track timing variations due to temperature and voltage;

4. register outputs are available for tests, trouble shooting and timing analyses; and 5. manufacturing repeatability (consistency from board to board) is improved over boards that use fixed delays to control timing.

BRIEF DESCRIPTION OF THE DRAWINGS

FIG. 2 is a timing diagram for the time from column address select (T-CAS) to memory access and is a timing diagram for the precharge time for Row Address Select (T-RP), or the "OFF" period between consecutive assertions of that signal;

FIG. 3 is recalibrating mode of TCTC at refresh time.

DETAILED DESCRIPTION OF THE INVENTION

Figure 1:
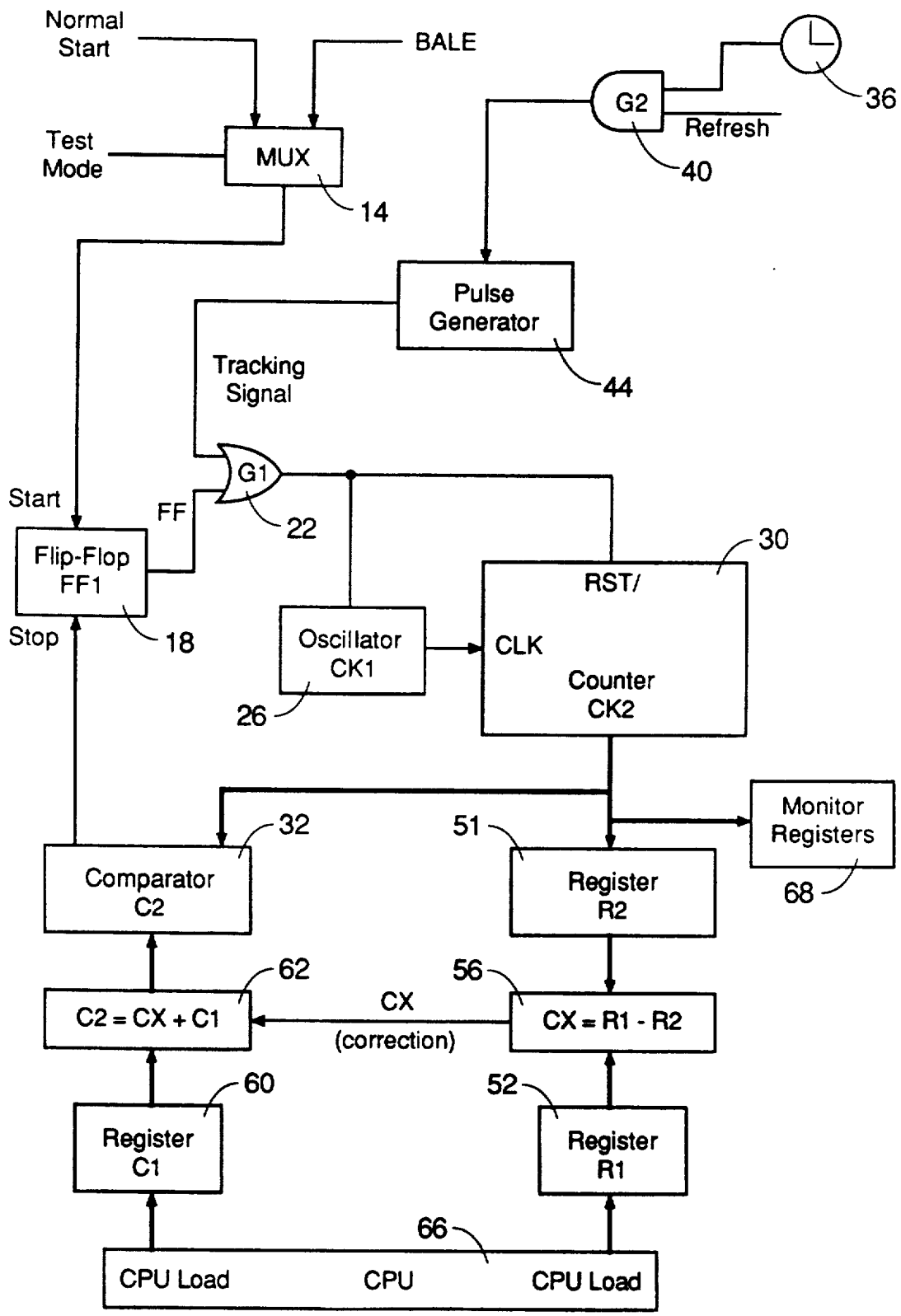
FIG. 1 illustrates the TCTC in block diagram form.

Referring to FIG. 1, in normal operation, test mode 10 is disabled, and a normal start signal 12 is initiated through a multiplexer 14 (MUX). An edge (rising voltage signal) starts 16 of the output of MUX 14 will enable or activate a flip-flop (FF) 18. An output 20 of FF 18 proceeds through OR gate 22 to create a timed signal (ST) 24. Timed signal 24 starts an oscillator 26, which sends output signal 28 in turn to a counter 30. The counter will count up to a value C2 stored in a comparator 32. Comparator 32 contains the terminal count value C2 for the duration of signal 24. When the terminal count is reached, comparator 32 issues a stop signal 34 to flip-flop 18 which disables signal 24. When timed signal 24 is disabled, oscillator 26 ceases oscillation, and counter 30 is reset.

The TCTC circuits use Metal-Oxide Semiconductor (MOS) technology. The time delays through any MOS circuit are dependent on temperature and supply voltage changes. Time variations as great as 50% to 60% over normal temperature-voltage operation are common. Therefore, the TCTC includes tracking to compensate for these variations.

The tracking signal 38 within FIG. 1 is derived from a crystal oscillator clock 36 used on the computer bus. Such oscillators have better than 0.01% accuracy over temperature and voltage. Since the TCTC tracking is based on the accuracy of the crystal, precise tracking is accomplished to compensate for temperature and voltage variations. For the application using an ISA bus, the tracking signal will be derived from the bus crystal clock 36 (about 14.381 MHz, which is the industry standard video clock. Tracking signal only allows OSC to pass into rest of circuit.)

The AND gate 40 is a circuit which allows tracking to be performed only during a refresh input 42. The tracking is performed at this point because there are no memory "reads" nor "writes" during "refresh". This also makes tracking transparent to the user.

The tracking signal is developed in the pulse generator 44. In a first embodiment, the pulse duration of the tracking signal is two clock cycles of a 14.381 MHz crystal clock, which is about 139 nanoseconds. Thereafter, the tracking signal proceeds through the OR gate 22 to create signal STT 46. When tracking is being done, the signal ST 24 will not be used as the normal timed signal. In this case, appropriate gates (not shown) will be used to inhibit ST 24 as a timed signal STT 46. When tracking, counter 30 counts the time of the duration of the tracked signal. This is different from normal operation, because during normal operation, a pre-set time from the edge of the normal start signal 16 is counted.

After the tracking cycle, a new timed capacitance value, C2, may be the same as the old value, or it may be greater or less. As the oscillator 26 varies with temperature and voltage, the value of C2, the input signal 48 to comparator 32, will change to compensate.

At the end of the duration of the tracking signal, the contents of counter 30, a value of resistance designated as R2, will be loaded into a first register 51. A second register 54 will have an original resistance value R1, stored in memory. R2 and R1 are then compared in a subtractor circuit 56. The difference is designated as value CX, which may be a positive or negative value. CX is then added to the contents of a third register 60, by a corrector circuit 62. The contents of this third register are an original capacitance value C1. The results of this addition are stored into comparator 32. The equations for the above circuits are listed below:

Subtractor circuit $CX = R1 - R2$ (inputs to connector 62)

Corrector circuit $C2 = CX + C1$ (inputs to comparator 32)

When a manufacturer sells an add-on TCTC board, installation software 64 is included as part of the product and becomes an input to a customer central processing unit (CPU) 66. For a board with a TCTC, this software will set-up the initial values of registers C1 and R1. The preferred method of setting up the calibration is to read R2 in the tracking mode, then store this value in R1, and compute C1 based on equation 1 (shown later). Alternatively, the software commands may be used to cause a controller to read one or more monitor registers (discussed later), and compute a value of R1 and C1. As a second alternative, the software commands cause the controller to step through the values of R1 and C1 in a pass/fail test to determine the optimum values.

The TCTC has a plurality of monitor registers. These monitor registers 68 provide measurement points which are useful for testing and analysis of the timing signals. The monitor registers 68 are used in the test mode 10. When the test mode 10 is active, the Buffered Address Latch Enable (BALE) signal 70 will start flip-flop 18 instead of the normal start 12. Since the counter 30 is active (counting), certain events will cause the contents of counter 30 to be loaded into one of the monitor registers 68. These events may include beginning or terminating edges of misc. BUS signals as one sees fit to monitor. These registers will contain information pertaining to edge placement of misc. signals, use opposed to "BALE". The contents of these monitor registers now contain measurements of certain time intervals and the values of these registers can then be read for test purposes.

For example, if the user's computer 66 has a modem attached, technical service personnel can trouble-shoot the TCTC board remotely. After the modem connection is made, special test software would be used to read the monitor registers 68. This would give the technical service personnel a reading of the exact timing of the user's bus with the TCTC board plugged into it.

Additionally, these registers are useful for design evaluation and production tests. There are about (16) monitor registers 60 available. The times stored in the monitor registers include: BALE to Address ENable (AEN). BALE to MEMory Read (MEMR) and BALE to MEMory Write (MEMW).

In the first embodiment, the TCTC is used in two circuits. A first circuit controls dynamic memory T-CAC time and a second circuit will control the T-RP time. T-CAC is the time from Column Address Select (CAS) to memory access, and is nominally 60 nanoseconds. T-RP is the Row Address Select (RAS) precharge time, and is nominally 80 nanoseconds. The oscillator 26 will have a period of about 3 nanoseconds.

The resolution of the tracking measurement and the timed signal 24 depend on the frequency of the oscillator 26. For this first embodiment, the period of the oscillator 26 is about 3 nanoseconds. Increased resolution of the TCTC can be accomplished by the use of taps on the oscillator delay line (not shown in FIG. 1). In this way, a resolution less than 1 nanosecond can be obtained. Multiple tape can create a clock period, for example, less than 3 nanoseconds. Therefore, it would leave more resolution.

The period of the tracking signal 38 is about 140 nanoseconds, and can be designated as TS1. The nominal value of the timed signal 24 is TS2. For T-CAC, the value of TS2 is 60 nanoseconds, and for T-RP, TS2 is 80 nanoseconds.

Thus, $TSZ = Trp = 80ns$ a DRAM timing parameter, where Tcac is a DRAM timing parameter.

$$(C1 - C2)/TS2 = (R1 - R2)/TS1$$

which reduces to:

$$(C1 - C2) = (TS1/TS1) \times (R1 - R2) \qquad \text{Equation 1}$$

TS2/TS1 is denoted the scaling factor, and is used to determine the software calibration entered into the installation software 64. Consequently for T-CAC the scaling factor will be: $TS2/Ts1 = 60/139 = 0.43$ and for T-RP $80/139 = 0.58$.

The relationships for the various signals are shown in FIGS. 2 and 3. FIG. 2 discloses the time sequence for T-CAC/T-RP.

FIG. 2 shows the START pulse activating a TCTC circuit. START sets FF 18 resulting in the ST pulse becoming active and, in turn, activating the ring osc CKI. CKI now increments counter CK2. When CK2 equals the value store in register/comparator C2, a stop pulse is issued, resulting in the resetting of FF 18, the deactivation of pulse ST, and the resetting of counter CK2 to 0. Again, C2 contains information relating to the desired pulse within that of pulse ST.

FIG. 3 shows the tracking calibration, including waveforms associated with the recalibrating logic of the TCTC. In this example, system refresh time was selected for recalibrating the TCTC vs. any change in temperature and voltage. The ISA osc with $T = 69ns$ is divided by 2 to 139ns, since this value windows the TCAC and Trp timing. Tracking signal, therefore, is 139ns in width. Next, ST signal is activated, which causes CK2 to begin counting. When tracking signal stops, CK2 value is passed to register R2. This is subtracted from register 1 to give a correcting value to the C2 comparator used for normal timing mode.

The above description describes separate circuit elements. It is anticipated that in actual development the circuit elements may be combined. In its ultimate form, the circuit elements, including memory, are combined onto one CMOS chip. In general, the adjustment of the timing and calibration may be provided through hardware control.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

We claim:

1. A timing calibrate and track control circuit for use in a computer and with a central processing unit, the timing calibrate and track control circuit comprising:
  a. a multiplexer having a normal start signal input;
  b. a flip-flop connected to the multiplexer and receiving an edge start signal from the multiplexer;
  c. an OR gate connected to an output from the flip-flop;
  d. a counter connected to the OR gate and receiving an output timed signal from the OR gate;
  e. an oscillator connected also to the OR gate and receiving the OR gate output timed signal;
  f. an oscillator output connection to the counter;
  g. a counter output connection to:
    i. a comparator;
    ii. a first register; and
    iii. a plurality of monitor registers;
  h. a STOP signal connection from the comparator to a second input connection of the flip-flop;
  i. an AND gate connected to a crystal clock and receiving a signal from the crystal clock and a REFRESH signal as inputs;
  j. a pulse generator connected to an output from the AND gate;
  k. a tracking signal output from the pulse generator that connects to a second input of the OR gate, wherein the output timed signal of the OR gate is inhibited, and the counter counts the time of duration of the OR gate output timed signal;
  l. an installation software means that inputs critical timing parameters to a customer central processing unit (CPU);
  m. a second register that stores a value of resistance received from the CPU;
  n. a subtractor circuit that receives inputs from the first and second registers and provides an output correction signal;
  o. a third register that stores a value of a capacitance value received from the CPU;
  p. a corrector circuit that receives the output correction signal from the subtractor and a second signal from the third register, wherein an output to the comparator equals the sum of the output correction signal and the capacitance value from the third register;
  q. a test mode input signal to the multiplexer; and
  r. a buffered address latch enables input signal to the multiplexer used when the test mode input signal is received by the multiplexer.

2. The timing calibrate and track control circuit of claim 1, wherein the monitor registers may be monitored by phone modem remotely in order to check time delays and trouble shoot the circuit, when the test mode input signal is received by the multiplexer.

3. The timing calibrate and track control circuit of claim 1, wherein a time from column address select (T-CAS) to memory access is controlled by the operation of the timing calibrate and track control circuit.

4. The timing calibrate and track control circuit of claim 3, wherein the time T-CAS will be 60 nanoseconds.

5. The timing calibrate and track control circuit of claim 1, wherein the application will be to control a time for precharge of Row Address Select (T-RP).

6. The timing calibrate and track control circuit of claim 5, wherein the time for precharge T-RP will be 80 nanoseconds.

7. The timing calibrate and track control circuit of claim 1, wherein the oscillator has a period of no more than 3 nanoseconds.

* * * * *